United States Patent [19]

Sik

[11] Patent Number: 5,086,012

[45] Date of Patent: Feb. 4, 1992

[54] METHOD FOR FORMING A FIELD OXIDE LAYER

[75] Inventor: Son Kwang Sik, Seoul, Rep. of Korea

[73] Assignee: Hyundai Electronics Industries Co., Ltd., Rep. of Korea

[21] Appl. No.: 664,660

[22] Filed: Mar. 5, 1991

[30] Foreign Application Priority Data

Mar. 6, 1990 [KR] Rep. of Korea .................. 90-2898

[51] Int. Cl.$^5$ .................................... H01L 21/302
[52] U.S. Cl. .................................... 437/70; 437/61; 437/62; 437/228; 437/238; 437/56; 437/981
[58] Field of Search .................. 437/61, 70, 228, 238, 437/62, 56, 63, 981

[56] References Cited

U.S. PATENT DOCUMENTS 4,775,644 10/1988 Szeto .................................... 437/69
4,885,261 12/1989 Yoshikawa ........................... 437/228

FOREIGN PATENT DOCUMENTS 0005821 1/1987 Japan .

Primary Examiner—Brian E. Hearn
Assistant Examiner—Trung Dang
Attorney, Agent, or Firm—Ladas & Parry

[57] ABSTRACT

A method for forming a field oxide layer in an integrated semiconductor device is disclosed. A first oxide layer and a first photoresist layer is sequentially deposited on a silicon substrate. A first separation mask pattern is then formed by removing a portion of the first photoresist layer to expose a portion of the first oxide layer, such that a plurality of separation regions is defined at the silicon substrate. An ion-implantation process is performed through the exposed first oxide layer into a portion of the silicon substrate positioned at the defined separation regions utilizing the first separation mask pattern. The first photoresist layer remaining on the first oxide layer is removed to expose the entire surface of the first oxide layer. A second oxide layer and a second photoresist layer is sequentially deposited on the entire surface of the first oxide layer. A second separation mask pattern is formed by removing the second photoresist layer except for those portions of the second photoresist layer positioned above the defined separation regions to expose a portion of the second oxide layer. A plurality of field oxide layers is formed at the defined separation regions by sequentially removing the exposed portion of the second oxide layer and the first oxide layer thereunder utilizing the second separation mask pattern. The remaining second photoresist layer is removed to expose the plurality of field oxide layer.

20 Claims, 4 Drawing Sheets

"PRIOR ART"

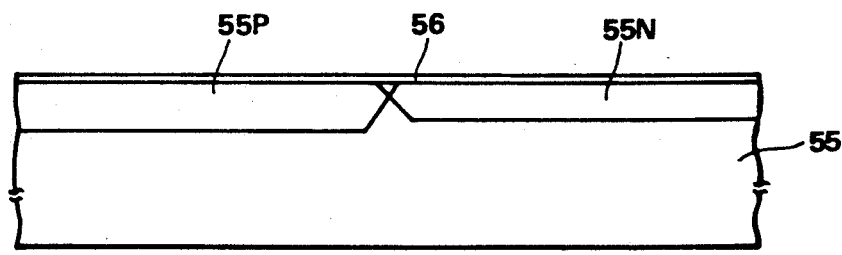
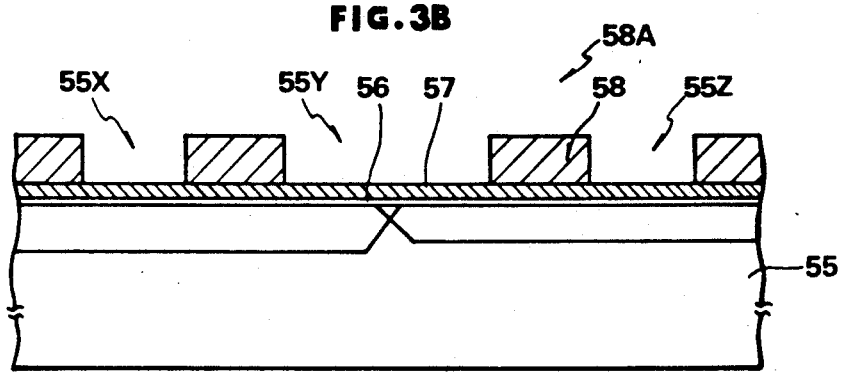
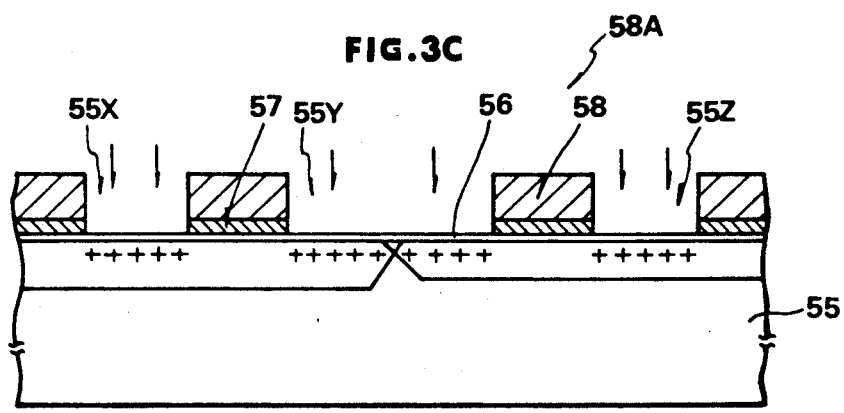
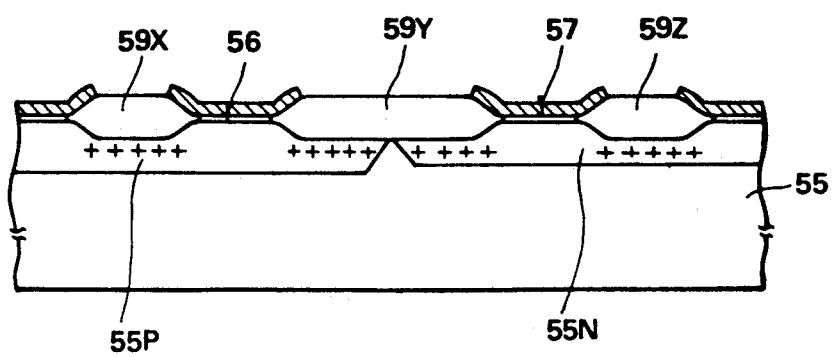

METHOD FOR FORMING A FIELD OXIDE LAYER

BACKGROUND OF INVENTION

1. Field of the Invention

The invention relates to a method for forming a field oxide layer for separating device to device in a highly integrated semiconductor device, and more particularly to a method for forming a field oxide layer which eliminates the bird's beak phenomena that occurs during the manufacturing process of the field oxide layer, thereby reducing the unit area of the semiconductor device.

Generally, in order to form a field oxide layer for separating device to device according to the prior art as illustrated in FIG. 1, a substrate oxide layer 2 is formed on a silicon substrate 1. A nitride layer 3 is then deposited on the entire surface of the substrate oxide layer 2. A portion of the nitride layer 3 is removed by a mask pattern process and an etching process in order to expose a portion of the substrate oxide layer 2, thereby defining active regions 1X, 1Y on the substrate 1 which underlies the remaining nitride layer 3. Thereafter, an impurity is implanted into the exposed portion of the substrate oxide layer 2. The exposed substrate oxide layer 2 is then oxidized by a LOCOS (Local Oxidation of Silicon) process, so that a field oxide layer 4 is formed both on the substrate oxide layer 2 and into the silicon substrate 1.

However, in the prior art described above, when the field oxide layer 4 is formed on the substrate 1, the bird's beak phenomena occurs in the nitride layer 3 at the defined active regions 1X, 1Y due to the presence of the field oxide layer, which cause the area of the active region to become relatively reduced. Accordingly, in order to solve such a problem, the width of the nitride layer 3 formed on the active regions 1X, 1Y should be determined by considering the size of the bird's beak 4X, 4Y which may occur during the forming process of the field oxide layer.

Further, in order to reduce the size of the bird's beak 4X, 4Y, a method for decreasing the thickness of the field oxide layer 4 has also been suggested. However, according to the above mentioned method, when the thickness of the field oxide layer 4 is reduced, the field oxide layer 4 can not accomplish its inherent separation function. Such a loss in function causes leakage current to be occurred between devices, when in use a strong electric field is applied to the surroundings of the field oxide layer 4.

Still furthermore, in order to reduce the size of the bird's beak 4X, 4Y, a method for increasing the thickness of the nitride layer 3, instead of decreasing the thickness of the substrate oxide layer 2 on the silicon substrate 1, has also been suggested. However, according to the above mentioned method, when mechanical stress is applied to the substrate, the crystallization structure of the substrate can be destroyed which results in the leakage current between devices, as mentioned above.

Therefore, according to the prior art, when a substrate oxide layer and a nitride layer are used, the nitride layer is selectively removed by a lithographic-etching process that utilizes the separation mask pattern to expose a portion of the substrate oxide layer. A field oxide layer is then grown both on the exposed substrate oxide layer and into the substrate, as mentioned above. The resulting field oxide layer is then grown to the certain extent on a portion of the silicon substrate, which underlies the nitride layer. This results in the undesirable formation of the bird's beak shape in the nitride layer positioned at the active region. As a result, the width of unit cell becomes excessively large.

Therefore, it is an object of the present invention to solve the problems presented in the prior art and to provide a method for forming a field oxide layer wherein an oxide layer for field oxide layer is deposited on the entire surface of the resulting structure, and, by utilizing a photoresist layer of the separation mask pattern, a field oxide layer is formed by lithographically etching the oxide layer for field oxide layer, utilizing the separation mask pattern.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A method for forming a field oxide layer of the present invention is defined by the claims with a specific embodiment shown in the attached drawings. For the purpose of summarizing the invention, the invention relates to a method for forming a field oxide layer in an integrated semiconductor device. An one embodiment of the present invention provides a silicon substrate including a P-region and an N-well region. A first oxide layer and a first photoresist layer is sequentially deposited on the silicon substrate. A first separation mask pattern is then formed by removing a portion of the first photoresist layer to expose a portion of the first oxide layer, thereby defining a plurality of separation regions at the silicon substrate. Each separation region is spaced apart relative to each other. An ion-implantation process is performed through the exposed first oxide layer into a portion of the silicon substrate positioned at the defined separation regions, utilizing the first separation mask pattern. The first photoresist layer remaining on the first oxide layer is then removed to expose the entire surface of the first oxide layer. A second oxide layer and a second photoresist layer is sequentially deposited on the entire surface of the first oxide layer. A second separation mask pattern is then formed by removing the second photoresist layer except for those portions of the second photoresist layer positioned above the defined separation regions, to thereby expose a portion of the second oxide layer. A plurality of field oxide layers is formed at the defined separation regions by sequentially removing the exposed portion of the second oxide layer and the first oxide layer thereunder utilizing the second separation mask pattern. The remaining second photoresist layer is removed which is positioned in such a way to expose the plurality of field oxide layer thereunder.

An another embodiment of the present invention provides a silicon substrate including a P-well region and an N-well region. A first oxide layer, a nitride layer and a first photoresist layer is sequentially deposited on the silicon substrate. A first separation mask pattern is then formed by removing a portion of the first photoresist layer to expose a portion of the nitride layer, thereby defining a plurality of separation regions at the silicon substrate. Each separation region is spaced apart relative to each other. The exposed portion of the nitride layer positioned at the defined separation regions is removed by utilizing the first separation mask pattern, to expose a portion of the first oxide layer positioned thereunder. An ion-implantation process is then performed through the exposed first oxide layer into a portion of the silicon substrate positioned at the defined separation regions utilizing the first separation mask pattern. The first photoresist layer remaining on the nitride layer is removed to expose the remaining nitride layer and the first oxide layer which is positioned at the defined separation regions. A plurality of channel oxide layers is formed on the exposed first oxide layer and into the silicon substrate which is positioned at the defined separation regions. The remaining nitride layer, the underlying first oxide layer is then removed and the plurality of channel oxide layers is then removed to form a plurality of cavities at the defined separation regions. A second oxide layer and a second photoresist layer is sequentially deposited on the entire surface of the resulting structure including the plurality of cavities. A second separation mask pattern is formed by removing the second photoresist layer except for those portions of the second photoresist layer which was positioned above the defined separation regions, to thereby expose a portion of the second oxide layer. A plurality of field oxide layers is then formed at the plurality of cavities which are positioned at the defined separation regions by removing the exposed portion of the second oxide layer utilizing the second separation mask pattern, to thereby expose a portion the silicon substrate. The remaining second photoresist layer is removed which is positioned to expose the plurality of field oxide layers thereunder.

A still another embodiment of the present invention provides a silicon substrate including a P-well region and an N-well region. A first oxide layer, a nitride layer and a first photoresist layer is sequentially deposited on the silicon substrate. A first separation mask pattern is then formed by removing a portion of the first photoresist layer to expose a portion of the nitride layer, thereby defining a plurality of separation regions at the silicon substrate. Each separation region is spaced apart relative to each other. The exposed portion of the nitride layer positioned at the defined separation regions is removed by utilizing the first separation mask pattern, to thereby expose a portion of the first oxide layer positioned thereunder. The first photoresist layer remaining on the nitride layer is removed to expose the remaining nitride layer and the first oxide layer which is positioned at the defined separation regions. A plurality of channel oxide layers is then formed on the exposed first oxide layer and into the silicon substrate positioned at the defined separation regions. The remaining nitride layer, the underlying first oxide layer and the plurality of channel oxide layers is removed to form a plurality of cavities at the defined separation regions. An ion-implantation process is then performed into the cavities which are positioned the defined separation regions of the silicon substrate. A second oxide layer and a second photoresist layer is sequentially deposited on the entire surface of the resulting structure including the plurality of cavities. A second separation mask pattern is formed by removing the second photoresist layer except for those portions of the second photoresist layer which are positioned above the defined separation regions, to thereby expose a portion of the second oxide layer. A plurality of field oxide layers is then formed at the plurality of cavities which are positioned at the defined separation regions by removing the exposed portion of the second oxide layer utilizing the second separation mask pattern, to thereby expose a portion the silicon substrate. The remaining second photoresist layer is removed so positioned to expose the plurality of field oxide layers thereunder.

Preferably, the ion-implantation process of the silicon substrate is performed by implanting a dopant selected from the group consisting of: B (Boron) or BF (Boro-Fluorine) into the P-well region of the silicon substrate positioned at the defined separation regions, and by implanting a dopant selected from the group consisting of: P (Phosphorus) or As (Arsenic) into the N-well region thereof, respectively. The impurity dopant is implanted simultaneously with the application of 20–150 KeV.

Preferably, the implanted silicon substrate has an impurity number of $10^{10}$–$10^{14}$ cm$^{-2}$.

Preferably, the first separation mask pattern and the second separation mask pattern have opposite polarity relative to each other.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

FIGS. 3A through FIG. 3H are cross sectional views of the process steps for forming a field oxide layer according to the second embodiment of the present invention;

Figure 1:
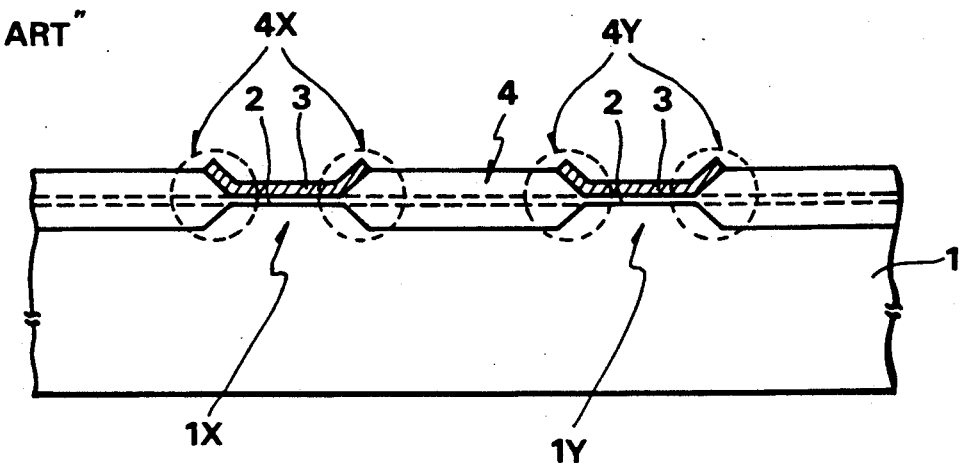
FIG. 1 is a cross sectional view of the semiconductor device in which a field oxide layer is formed according to the prior art.

The novel feature of the present invention may be understood from the accompanying description when taken in conjunction with the accompanying drawings.

Similar reference characters refer to similar parts throughout the several views of the drawings.

DETAILED DESCRIPTION OF THE INVENTION

FIG. 1 illustrates a cross sectional view of a field oxide layer 4 in which a bird's beak 4X, 4Y phenomena occurs at the nitride layer 3 positioned on active regions 1X, 1Y due to the prior art LOCOS process. The detailed description of the process steps will be abbreviated since they are mentioned in the opening paragraph.

FIGS. 2A through FIG. 2F are cross sectional views of the semiconductor device showing the process steps for forming a field oxide layer according to the first embodiment of the present invention.

Figure 2A:
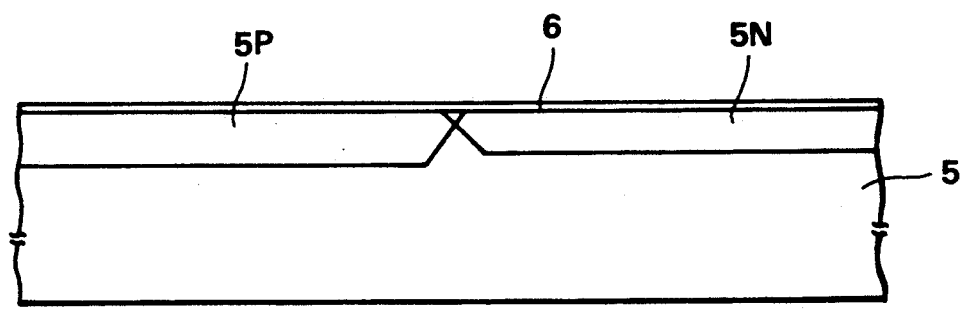
FIGS. 2A through FIG. 2F are cross sectional views of the process steps for forming a field oxide layer according to the first embodiment of the present invention.

FIG. 2A illustrates a cross sectional view of the semiconductor in which an N-well region 5N and P-well region 5P are formed into a silicon substrate 5 at a predetermined depth, and a first oxide layer 6 is then deposited on both the N-well region 5N and the P-well region 5P, to a thickness of 100-500 Angstroms. Here, it should be noted that the N-well region 5N and the P-well region 5P may not be formed, if necessary.

Figure 2B:
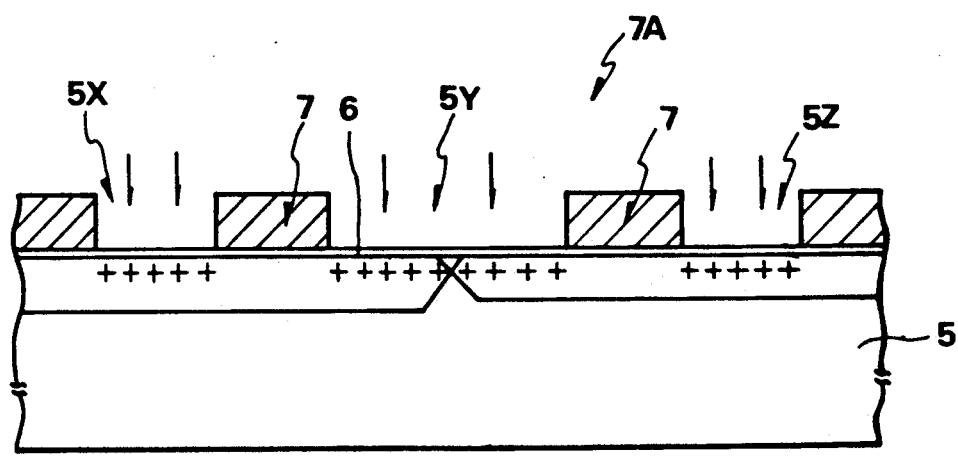

FIG. 2B illustrates a cross sectional view of the semiconductor device in which a first photoresist layer 7 is deposited entirely on the first oxide layer 6. A portion of the first photoresist layer 7 is then removed for forming a first separation mask pattern 7A, thereby defining a plurality of separation regions 5X, 5Y and 5Z at predetermined portions at which those portions of the first oxide layer 6 are exposed. In order to enhance the electrical separation characteristic of the separation regions 5X, 5Y and 5Z, an ion-implantation process is performed by implanting a dopant source into the P-well region 5P and N-well region 5N of the silicon substrate 5 underlying the first oxide layer 6 positioned at the defined separation regions 5X, 5Y and 5Z, utilizing the first separation mask pattern 7A. Here, the impurity dopant implanted into the P-well region 5P is selected from the group consisting of: B (Boron) or $BF_2$ (Boro-Fluorine), while the impurity dopant implanted into the N-well region 5N is selected from the group consisting of: P (Phosphorus) or As (Arsenic), respectively. Each impurity dopant has an impurity number of $10^{10}-10^{14}$ (cm$^{-2}$). The impurity dopant is implanted simultaneously with the application of 20 KeV-150 KeV energy.

Figure 2C:
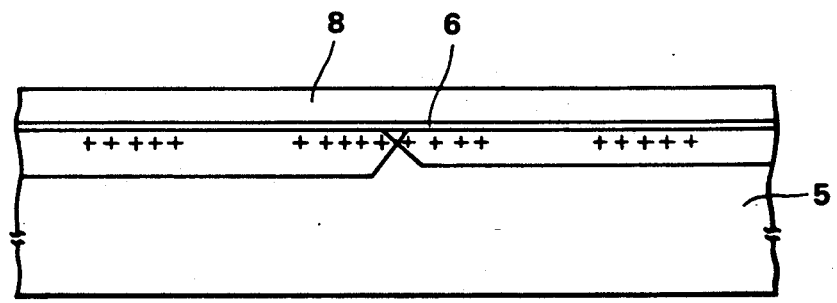

FIG. 2C illustrates a cross sectional view of the semiconductor device in which the remaining first photoresist layer 7 is removed. A second oxide layer 8 is then deposited on the first oxide layer 6 to a thickness of 3000-8000 Angstroms. Here, it should be noted that the first oxide layer 6 can be removed before the second oxide layer 8 is deposited.

Figure 2D:
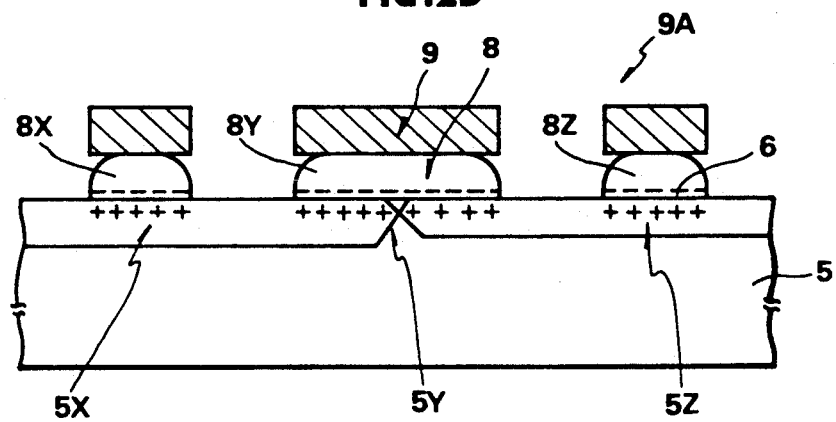

Referring to FIG. 2D, a second photoresist layer 9 is deposited on the entire surface of the second oxide layer 8. In order to form a second separation mask pattern 9A, a portion of the second photoresist layer 9 except for those portions positioned above the defined separation regions 5X, 5Y and 5Z is selectively removed, to thereby expose a portion of the second oxide layer 8 thereunder. A plurality of field oxide layers 8X, 8Y and 8Z, which are spaced apart relative to each other, are formed by sequentially removing the exposed second oxide layer 8 and a portion of the first oxide layer 6, utilizing the second separation mask pattern 9A, thereby exposing a portion of the silicon substrate 5. Here, the second separation mask patter 9A and the first separation mask pattern 7A have opposite polarity relative to each other, and each of field oxide layers 8X, 8Y and 8Z includes a portion of the first oxide layer 6 positioned, respectively, above the separation regions 5X, 5Y and 5Z. Moreover, the etching process of field oxide layers 8X, 8Y and 8Z utilizes a wet etching or a dry etching, or an isotropic etching combined with wet etching and dry etching in order to round the edges of both sides of the respective field oxide layers 8X, 8Y and 8Z, as shown in the drawing.

Figure 2E:
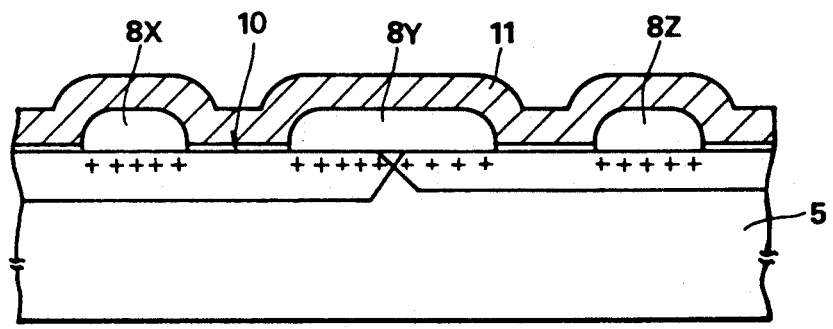

Referring to FIG. 2E, the remaining second photoresist layer 9 for second separation mask pattern 9A which is positioned to expose the field oxide layers 8X, 8Y and 8Z is removed entirely. A gate oxide layer 10 is then formed on the exposed portion of the silicon substrate 5. A poly layer 11 is deposited as a conductive layer on the entire surface of the resulting structure.

Figure 2F:
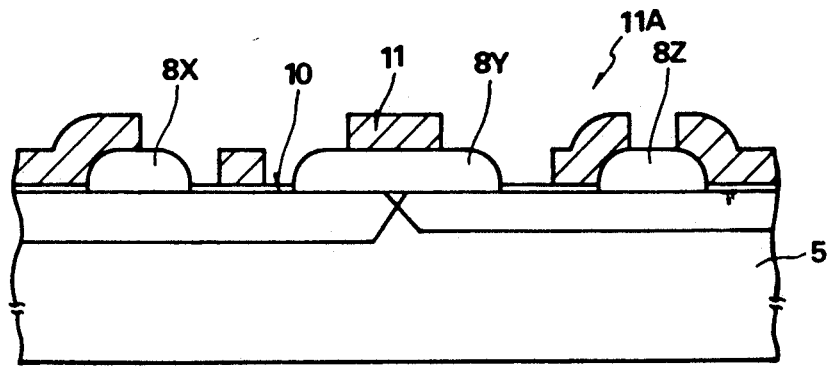

FIG. 2F illustrates a cross sectional view of the semiconductor device in which a portion of the poly layer 11 is removed utilizing a gate mask pattern 11A in order to form the semiconductor device with a desired purpose.

FIGS. 3A through FIG. 3H are cross sectional views of the semiconductor device showing the process steps for forming a field oxide layer according to the second embodiment of the present invention.

FIG. 3A illustrates a cross sectional view of the semiconductor device in which a P-well region 55P and an N-well region 55N are formed into a silicon substrate 55 to a predetermined depth. A first oxide layer 56 is then deposited on both the P-well region 55P and N-well region 55N, as thick as 100-500 Angstroms.

FIG. 3B shows that a nitride layer 57 is deposited on the first oxide layer 56, as thick as, 500-1500 Angstroms. A first photoresist layer 58 is then deposited thereon. A portion of the first photoresist layer 58 is then removed to form a first separation mask pattern 58A, thereby exposing a portion of the nitride layer 57. Portions underlying the exposed portion of the nitride layer 57 are defined as separation regions 55X, 55Y and 55Z.

Referring to FIG. 3C, the exposed nitride layer 57 positioned above the defined separation regions 55X, 55Y and 55Z is etched by utilizing the first separation mask pattern 58A. Thereafter, if necessary, in order to enhance the electrical separation characteristic of the separation regions 55X, 55Y and 55Z, an impurity dopant selected from the group consisting of: B (Boron) or $BF_2$ (Boro-Fluorine) is implanted into the P-well region 55P of the silicon substrate 55 positioned at the defined separation regions 55X, 55Y and 55Z. An impurity dopant selected from the group consisting of: P (Phosphorus) or As (Arsenic) is also implanted into the N-well region 55N. Each impurity dopant has an impurity number of $10^{10}-10^{14}$ (cm$^{-2}$). The impurity dopant is implanted simultaneously with the application of 20-150 KeV.

Referring to FIG. 3D, the remaining first photoresist layer 58 for first separation mask pattern 58A is removed entirely to expose both the nitride layer 57 positioned thereunder and the first oxide layer 56 positioned therebetween. A plurality of channel oxide layers 59X, 59Y and 59Z are then grown both into the P-well region 55P and N-well region 55N and on the exposed first oxide layer 56 except for the exposed nitride layer 57, to a thickness of 1000-8000 Angstroms. The reasons for forming the channel oxide layers 59X, 59Y and 59Z are formed is to drive the ion-implanted impurity into the silicon substrate, and to increase the effective length of the field gate which is formed during the formation of the field oxide layer.

Figure 3E:
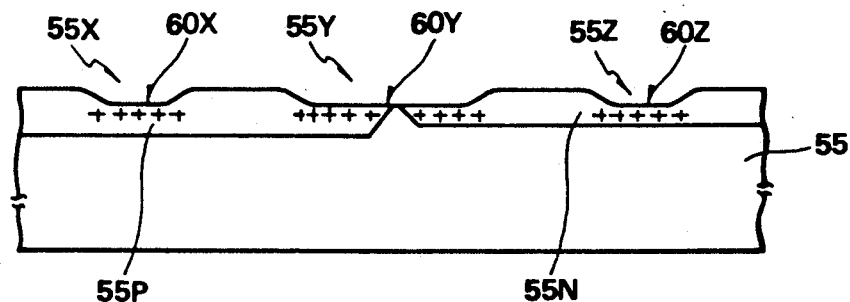

Referring to FIG. 3E, the remaining nitride layer 57 is entirely removed. The channel oxide layers 59X, 59Y and 59Z and the exposed first oxide layer 56 are removed to expose the silicon substrate 55 having the P-well region 55P and the N-well region 55N, thereby obtaining a plurality of cavities 60X, 60Y and 60Z which are positioned at the defined separation regions 55X, 55Y and 55Z. At this point, it is desirable for the nitride layer 57 and the channel oxide layers 59X, 59Y and 59Z to be removed utilizing the wet etching method. It should also be appreciated that, instead of performing the ion-implantation process in connection with FIG. 3C, the ion-implantation process can be performed at the plurality of cavities 60X, 60Y and 60Z in conjunction with FIG. 3E.

Figure 3F:
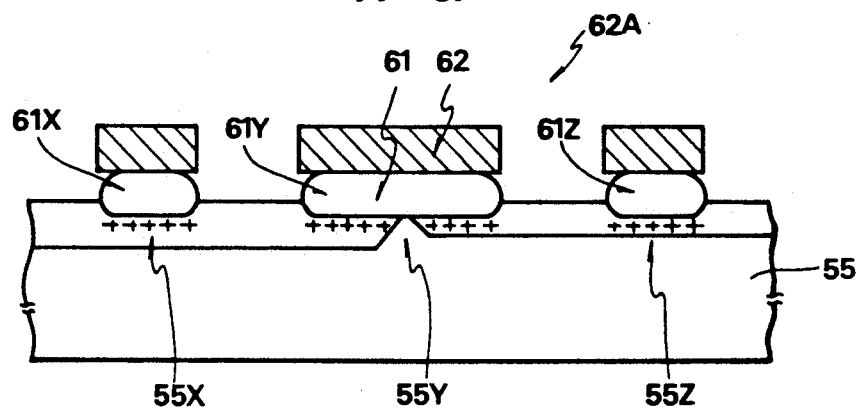

Referring to FIG. 3F, a second oxide layer 61 is deposited on the entire surface of the resulting silicon substrate 55, as thick as, 3000-8000 Angstroms. The second photoresist layer 62 is then deposited thereon. A portion of the second photoresist layer 62, except for those portions positioned above the defined separation regions 55X, 55Y and 55Z, is selectively removed in order to form a second separation mask pattern 62A, thereby exposing a portion of the second oxide layer 61. The exposed second oxide layer 61 is isotropically etched by utilizing the second separation mask pattern 62A, to thereby form a plurality of field oxide layers 61X, 61Y and 61Z onto the cavities 60X, 60Y and 60Z positioned at the defined separation regions 55X, 55Y and 55Z, thereby exposing a portion of the silicon substrate 55. It is noted that the second separation mask pattern 62A and the first separation mask pattern 58A have opposite polarity relative to each other.

Figure 3G:
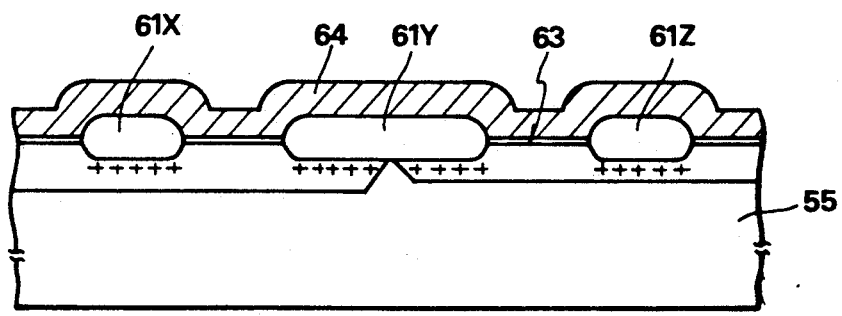

Referring to FIG. 3G, the remaining second photoresist 62 which is positioned to expose the field oxide layers 61X, 61Y and 61Z is then completely removed. A gate oxide layer 63 is then formed on the exposed portion of the silicon substrate 55, as illustrated in FIG. 3F. A poly layer 64 is deposited as a conductive layer on the entire surface of the resulting structure.

Figure 3H:
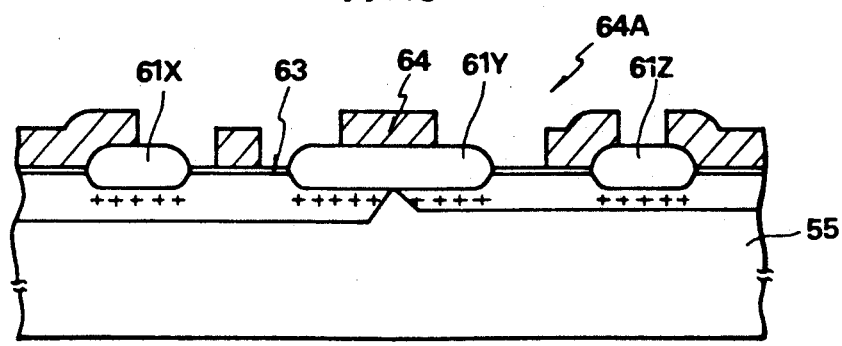

Referring to FIG. 3H, a desired portion of the poly layer 64 is etched utilizing a gate pattern 64A in order to form the semiconductor device with a desired purpose.

As described above, according to the present invention, since a field oxide layer is formed by utilizing a lithographic etching, the bird's beak problem of the prior art can be eliminated so that the size of the device decreases and the separation effect increases.

Furthermore, as mentioned in the second embodiment, the separation effect is successively achieved because a cavity is formed at the previously defined separation region in the silicon substrate, and a field oxide layer is then selectively formed in the cavity.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for forming a field oxide layer in an integrated semiconductor device comprises:
   providing a silicon substrate;
   sequentially depositing a first oxide layer and a first photoresist layer on the silicon substrate;
   forming a first separation mask pattern by removing a portion of the first photoresist layer to expose a portion of the first oxide layer, thereby defining a plurality of separation regions at the silicon substrate, with each separation region being spaced apart relative to each other;
   performing an ion-implantation process through the exposed first oxide layer into a portion of the silicon substrate positioned at the defined separation regions utilizing the first separation mask pattern;
   removing the first photoresist layer remaining on the first oxide layer to thereby expose the entire surface of the first oxide layer;
   sequentially depositing a second oxide layer and a second photoresist layer on the entire surface of the first oxide layer;
   forming a second separation mask pattern by removing the second photoresist layer except for those portions of the second photoresist layer positioned above the defined separation regions, to thereby expose a portion of the second oxide layer;
   forming a plurality of field oxide layers at the defined separation regions by sequentially removing the exposed portion of the second oxide layer and the first oxide layer thereunder utilizing the second separation mask pattern; and
   removing the remaining second photoresist layer so positioned to expose the plurality of field oxide layer thereunder.

2. The method of claim 1 wherein the silicon substrate further comprises a P-well region and an N-well region.

3. The method of claim 1 wherein the first separation mask pattern and the second separation mask pattern have opposite polarity relative to each other.

4. The method of claim 1 wherein the plurality of field oxide layers is formed by isotropically etching the exposed second oxide layer and the first oxide layer thereunder utilizing the second separation mask pattern.

5. A method for forming a field oxide layer in an integrated semiconductor device comprises:
   providing a silicon substrate including a P-well region and an N-well region;
   sequentially depositing a first oxide layer and a first photoresist layer on the silicon substrate;
   forming a first separation mask pattern by removing a portion of the first photoresist layer to expose a portion of the first oxide layer, thereby defining a plurality of separation regions at the silicon substrate, with each separation region being spaced apart relative to each other;
   performing an ion-implantation process through the exposed first oxide layer into a portion of the P-well region and N-well region of the silicon substrate positioned at the defined separation regions utilizing the first separation mask pattern;
   removing the first photoresist layer remaining on the first oxide layer to thereby expose the entire surface of the first oxide layer;
   sequentially depositing a second oxide layer and a second photoresist layer on the entire surface of the first oxide layer;
   forming a second separation mask pattern by removing the second photoresist layer except for those portions of the second photoresist layer positioned above the defined separation regions, to thereby expose a portion of the second oxide layer;

forming a plurality of field oxide layers at the defined separation regions by sequentially removing the exposed portion of the second oxide layer and the first oxide layer thereunder utilizing the second separation mask pattern; and removing the remaining second photoresist layer so positioned to expose the plurality of field oxide layer thereunder.

6. The method of claim 5 wherein the ion-implantation process of the silicon substrate is performed by implanting a dopant selected from the group consisting of: B (Boron) or $BF_2$ (Boro-Fluorine) into the P-well region of the silicon substrate positioned at the defined separation regions and by implanting a dopant selected from the group consisting of: P (Phosphorus) or As (Arsenic) into the N-well region thereof, respectively, with simultaneously application of 20–150 KeV.

7. The method of claim 6 where the implanted silicon substrate has an impurity number of $10^{10}$–$10^{14}$ $cm^{-2}$.

8. The method of claim 5 wherein the first separation mask pattern and the second separation mask pattern have opposite polarity relative to each other.

9. The method of claim 5 wherein the plurality of field oxide layers is formed by isotropically etching the exposed second oxide layer and the first oxide layer thereunder utilizing the second separation mask pattern.

10. A method for forming a field oxide layer in an integrated semiconductor device comprises:

providing a silicon substrate including a P-well region and an N-well region;

sequentially depositing a first oxide layer and a first photoresist layer on the silicon substrate;

forming a first separation mask pattern by removing a portion of the first photoresist layer to expose a portion of the first oxide layer, thereby defining a plurality of separation regions at the silicon substrate, with each separation region being spaced apart relative to each other;

performing an ion-implantation process through the exposed first oxide layer utilizing the first separation mask pattern, by implanting a dopant selected from the group consisting of: B (Boron) or $BF_2$ (Boro-Fluorine) into the P-well region of the silicon substrate positioned at the defined separation regions and by implanting a dopant selected from the group consisting of: P (Phosphorus) or As (Arsenic) into the N-well region thereof, respectively, with simultaneously application of 20–150 KeV;

removing the first photoresist layer remaining on the first oxide layer to thereby expose the entire surface of the first oxide layer;

sequentially depositing a second oxide layer and a second photoresist layer on the entire surface of the first oxide layer;

forming a second separation mask pattern by removing the second photoresist layer except for these portions of the second photoresist layer positioned at the defined separation regions, to thereby expose a portion of the second oxide layer;

forming a plurality of field oxide layers at the defined separation regions by isotropically etching the exposed portion of the second oxide layer and the first oxide layer thereunder utilizing the second separation mask pattern; and removing the remaining second photoresist layer so positioned to expose the plurality of field oxide layer thereunder.

11. A method for forming a field oxide layer in an integrated semiconductor device comprises:

providing a silicon substrate;

sequentially depositing a first oxide layer, a nitride layer and a first photoresist layer on the silicon substrate;

forming a first separation mask pattern by removing a portion of the first photoresist layer to expose a portion of the nitride layer, thereby defining a plurality of separation regions at the silicon substrate, with each separation region being spaced apart relative to each other;

removing the exposed portion of the nitride layer positioned at the defined separation regions utilizing the first separation mask pattern, to thereby expose a portion of the first oxide layer positioned thereunder;

performing an ion-implantation process through the exposed first oxide layer into a portion of the silicon substrate positioned at the defined separation regions utilizing the first separation mask pattern;

removing the first photoresist layer remaining on the nitride layer to thereby expose the remaining nitride layer and the first oxide layer positioned at the defined separation regions;

forming a plurality of channel oxide layers on the exposed first oxide layer and into the silicon substrate positioned at the defined separation regions;

removing the remaining nitride layer, the underlying first oxide layer and the plurality of channel oxide layers to form a plurality of cavities at the defined separation regions;

sequentially depositing a second oxide layer and a second photoresist layer on the entire surface of the resulting structure including the plurality of cavities;

forming a second separation mask pattern by removing the second photoresist layer except for those portions of the second photoresist layer positioned above the defined separation regions, to thereby expose a portion of the second oxide layer;

forming a plurality of field oxide layers at the plurality of cavities positioned at the defined separation regions by removing the exposed portion of the second oxide layer utilizing the second separation mask pattern to thereby expose a portion the silicon substrate; and removing the remaining second photoresist layer so positioned to expose the plurality of field oxide layers thereunder.

12. The method of claim 11 wherein the silicon substrate further comprises a P-well region and an N-well region.

13. The method of claim 11 wherein the first separation mask pattern and the second separation mask pattern have opposite polarity relative to each other.

14. The method of claim 11 wherein the plurality of field oxide layers is formed by isotropically etching the exposed second oxide layer utilizing the second separation mask pattern.

15. A method for forming a field oxide layer in an integrated semiconductor device comprises:

providing a silicon substrate including a P-well region and an N-well region;

sequentially depositing a first oxide layer, a nitride layer and a first photoresist layer on the silicon substrate;

forming a first separation mask pattern by removing a portion of the first photoresist layer to expose a portion of the nitride layer, thereby defining a plurality of separation regions at the silicon substrate, with each separation region being spaced apart relative to each other;

removing the exposed portion of the nitride layer positioned at the defined separation regions utilizing the first separation mask pattern, to thereby expose a portion of the first oxide layer positioned thereunder;

performing an ion-implantation process through the exposed first oxide layer into a portion of the P-well region and N-well region of the silicon substrate positioned at the defined separation regions utilizing the first separation mask pattern;

removing the first photoresist layer remaining on the nitride layer to thereby expose the remaining nitride layer and the first oxide layer positioned at the defined separation regions;

forming a plurality of channel oxide layers on the exposed first oxide layer and into the silicon substrate positioned at the defined separation regions;

removing the remaining nitride layer, the underlying first oxide layer and the plurality of channel oxide layers to form a plurality of cavities at the defined separation regions;

sequentially depositing a second oxide layer and a second photoresist layer on the entire surface of the resulting structure including the plurality of cavities;

forming a second separation mask pattern by removing the second photoresist layer except for those portions of the second photoresist layer positioned above the defined separation regions, to thereby expose a portion of the second oxide layer;

forming a plurality of field oxide layers at the plurality of cavities positioned at the defined separation regions by removing the exposed portion of the second oxide layer utilizing the second separation mask pattern to thereby expose a portion the silicon substrate; and removing the remaining second photoresist layer so positioned to expose the plurality of field oxide layers thereunder.

16. The method of claim 15 wherein the ion-implantation process of the silicon substrate is performed by implanting a dopant selected from the group consisting of: B (Boron) or BF$_2$ (Boro-Fluorine) into the P-well region of the silicon substrate positioned at the defined separation regions and by implanting a dopant selected from the group consisting of: P (Phosphorus) or As (Arsenic) into the N-well region thereof, respectively, with simultaneously application of 20-150 KeV.

17. The method of claim 16 where the implanted silicon substrate has an impurity number of $10^{10}$-$10^{14}$ cm$^{-2}$.

18. The method of claim 15 wherein the first separation mask pattern and the second separation mask pattern have opposite polarity relative to each other.

19. The method of claim 15 wherein the plurality of field oxide layers is formed by isotropically etching the exposed second oxide layer utilizing the second separation mask pattern.

20. A method for forming a field oxide layer in an integrated semiconductor device comprises:

providing a silicon substrate including a P-well region and an N-well region;

sequentially depositing a first oxide layer, a nitride layer and a first photoresist layer on the silicon substrate;

forming a first separation mask pattern by removing a portion of the first photoresist layer to expose a portion of the nitride layer, thereby defining a plurality of separation regions at the silicon substrate, with each separation region being spaced apart relative to each other;

removing the exposed portion of the nitride layer positioned at the defined separation regions utilizing the first separation mask pattern, to thereby expose a portion of the first oxide layer positioned thereunder;

removing the first photoresist layer remaining on the nitride layer to thereby expose the remaining nitride layer and the first oxide layer positioned at the defined separation regions;

forming a plurality of channel oxide layers on the exposed first oxide layer and into the silicon substrate positioned at the defined separation regions;

removing the remaining nitride layer, the underlying first oxide layer and the plurality of channel oxide layers to form a plurality of cavities at the defined separation regions;

performing an ion-implantation process into the plurality of cavities positioned at the defined separation regions by implanting a dopant selected from the group consisting of: B (Boron) or BF$_2$ (Boro-Fluorine) into the cavities positioned at the P-well region of the silicon substrate and by implanting a dopant selected from the group of: P(Phosphorus) or As(Arsenic) into the cavities positioned at the N-well region thereof, respectively, with simultaneously application of 20-150 KeV;

sequentially depositing a second oxide layer and a second photoresist layer on the entire surface of the resulting structure including the plurality of cavities;

forming a second separation mask pattern by removing the second photoresist layer except for those portions of the second photoresist layer positioned above the defined separation regions, to thereby expose a portion of the second oxide layer;

forming a plurality of field oxide layers at the plurality of cavities positioned at the defined separation regions by isotropically etching the exposed portion of the second oxide layer utilizing the second separation mask pattern to thereby expose a portion the silicon substrate; and removing the remaining second photoresist layer so positioned to expose the plurality of field oxide layers thereunder.

* * * * *